United States Patent
Brennan, Jr.

[11] Patent Number: 5,701,272
[45] Date of Patent: Dec. 23, 1997

[54] NEGATIVE VOLTAGE SWITCHING CIRCUIT

[75] Inventor: James Brennan, Jr., Saratoga, Calif.

[73] Assignee: Intel Corporation, Santa Clara, Calif.

[21] Appl. No.: 723,666

[22] Filed: Sep. 30, 1996

Related U.S. Application Data

[63] Continuation of Ser. No. 488,040, Jun. 7, 1995, abandoned.

[51] Int. Cl.$^6$ ..................................... G11C 7/00
[52] U.S. Cl. ............... 365/230.06; 365/149; 365/226
[58] Field of Search ..................... 365/230.06, 226, 365/189.09, 149, 225.6, 189.06

[56] References Cited

U.S. PATENT DOCUMENTS

| | | | |
|---|---|---|---|
| 4,636,983 | 1/1987 | Young et al. | 365/181 |
| 4,954,990 | 9/1990 | Vider | 365/185 |
| 5,126,808 | 6/1992 | Montalvo et al. | 357/23.5 |
| 5,132,935 | 7/1992 | Ashmore, Jr. | 365/185 |
| 5,253,201 | 10/1993 | Atsumi et al. | 365/185 |
| 5,282,170 | 1/1994 | Van Buskirk et al. | 365/226 |
| 5,293,344 | 3/1994 | Akaogi | 365/210 |
| 5,295,107 | 3/1994 | Okazawa et al. | 365/218 |
| 5,311,480 | 5/1994 | Schreck | 365/230.06 |
| 5,319,604 | 6/1994 | Imondi et al. | 365/230.06 |
| 5,335,200 | 8/1994 | Coffman et al. | 365/218 |
| 5,406,517 | 4/1995 | Chang et al. | 365/189.09 |
| 5,455,789 | 10/1995 | Nakamura et al. | 365/230.06 X |
| 5,477,499 | 12/1995 | Van Buskirk et al. | 365/218 |
| 5,499,217 | 3/1996 | Pascucci et al. | 365/230.06 |

*Primary Examiner*—Do Hyun Yoo
*Attorney, Agent, or Firm*—Blakely, Sokoloff, Taylor & Zafman

[57] ABSTRACT

A voltage switching circuit is described that includes a switching circuit for selectively coupling a first voltage to an output of the switching circuit. The first voltage has a voltage level substantially lower than zero volts. A control circuit is coupled to the switching circuit for controlling the switching circuit to couple the first voltage to the output by generating a second voltage having a voltage level lower than that of the first voltage from a third voltage having a voltage level substantially higher than zero volts.

18 Claims, 8 Drawing Sheets

NEGATIVE VOLTAGE SWITCHING CIRCUIT

This is a continuation of application Ser. No. 08/488,040, filed Jun. 7, 1995, now abandoned.

FIELD OF THE INVENTION

The present invention pertains to the field of integrated circuits. More particularly, this invention relates to a voltage switching circuit that couples a negative voltage to a nonvolatile memory, thereby allowing negative gate erasure of the nonvolatile memory.

BACKGROUND OF THE INVENTION

A prior flash erasable and electrically programmable read-only memory ("flash EPROM") typically uses memory cells that include electrically isolated gates (i.e., floating gates). Information is stored in the memory cells in the form of charge on the floating gates. FIG. 1 illustrates the structure of one such memory cell 10. Memory cell 10 includes a drain region 13 and a source region 14 in a substrate 15. Source region 14 and drain region 13 are asymmetrically doped with an arsenic dopant and source region 14 is additionally doped with a phosphorous dopant. A polysilicon floating gate 12 is generally disposed above and between these regions and insulated from these regions by an insulating layer 16. Floating gate 12 at the completion of processing is completely surrounded by insulating layers and hence electrically floats. A second gate (i.e., a control gate) 11 is disposed above floating gate 12 that is fabricated from a second layer of polysilicon. A second insulating layer 17 separates floating gate 12 from control gate 11.

As can be seen from FIG. 2A, memory cell 10 is programmed (i.e., negatively charging the floating gate) by coupling control gate 11 to a gate programming potential of approximately +12 volts, drain region 13 to a drain programming potential of approximately +7 volts, and source region 14 to ground. Under these conditions, channel hot electron injection occurs through oxide layer 16. The electrons deposited on floating gate 12 of memory cell 10 cause the threshold voltage of memory cell 10 to rise. Memory cell 10 is now programmed to have a programmed threshold voltage $V_{TP}$.

To erase cell 10, drain region 13 is floated, control gate 11 is grounded and an erasure potential of approximately +12 volts is applied to source region 14, as shown in FIG. 2B. Under these conditions, charge is tunneled from floating gate 12 to source region 14. This removes the electrons deposited on floating gate 12 of memory cell 10, causing the threshold voltage of memory cell 10 to decrease. Memory cell 10 is now erased to have an erased threshold voltage $V_{TE}$.

To read cell 10, a positive read potential less than that which would cause charge to transfer onto floating gate 12 is applied to control gate 11 (e.g., 5 volts) and a potential (e.g., 1 volt) is applied to drain region 13. Current through the device is sensed to determine if floating gate 12 is or is not negatively charged.

The speed at which memory cell 10 is erased largely depends on the erasure ability of memory cell 10 and the erasure voltage applied to the source of memory cell 10. Typically, the higher the erasure voltage applied to the source of memory cell 10, the faster memory cell 10 is being erased. However, one disadvantage of such prior art erasure technique is that if the erasure voltage applied to the source of memory cell 10 exceeds certain voltage threshold (e.g., 12 volts), the source-to-gate junction of memory cell 10 then moves into the breakdown region, at which hot holes are generated in floating gate 12 of memory cell 10. This is detrimental to the lifetime cycles of the memory cell. Therefore, the erasure voltage constraint typically limits the increase in the erasure speed of memory cell 10. In addition, when the source-to-gate junction of memory cell 10 is at the breakdown condition, the erasure speed of memory cell 10 does not increase when the erasure voltage increases.

SUMMARY OF THE INVENTION

One of the features of the present invention is to provide a voltage switching circuit for applying negative voltages (i.e., lower than zero volts) to an integrated circuit.

Another feature of the present invention is to allow negative gate erasure of memory cells of a nonvolatile memory.

A further feature of the present invention is to provide a negative voltage switching circuit with minimized power consumption.

A still further feature of the present invention is to provide a negative voltage switching circuit that generates a negative voltage from a positive voltage (i.e., higher than zero volts).

A voltage switching circuit is described that includes a switching circuit for selectively coupling a first voltage to an output of the switching circuit. The first voltage has a voltage level substantially lower than zero volts. A control circuit is coupled to the switching circuit for controlling the switching circuit to couple the first voltage to the output by generating a second voltage having a voltage level lower than that of the first voltage from a third voltage having a voltage level substantially higher than zero volts.

The control circuit of the above described voltage switching circuit, in one embodiment, includes a capacitor having a first end and a second end coupled to a gate of a switching transistor of the switching circuit via a node. A charging circuit is coupled to the first end of the capacitor for coupling the capacitor to the third voltage and for coupling the first end of the capacitor to ground when the capacitor has been charged to the third voltage. A coupling circuit is provided for coupling the node to ground when the charging circuit is charging the capacitor to the third voltage and for causing the node to be de-coupled from ground when the charging circuit couples the first end of the capacitor to ground such that the second voltage is generated and applied to the switching circuit.

The control circuit of the above described voltage switching circuit, in another embodiment, includes a first capacitor having a first end and a second end and a second capacitor having a first end and second end. A first logic circuit is coupled to the first end of each of the first and second capacitors for alternately coupling the first end of each of the first and second capacitors to one of (1) the third voltage and (2) ground. A second logic circuit is coupled to the second end of each of the first and second capacitors and the switching circuit for alternately coupling the second end of each of the first and second capacitors to the switching circuit to generate and apply the second voltage to the switching circuit. When the second logic circuit couples the second end of the first capacitor to the switching circuit and the second end of the second capacitor to ground, the first logic circuit couples the first end of the first capacitor to ground and the first end of the second capacitor to the third voltage.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
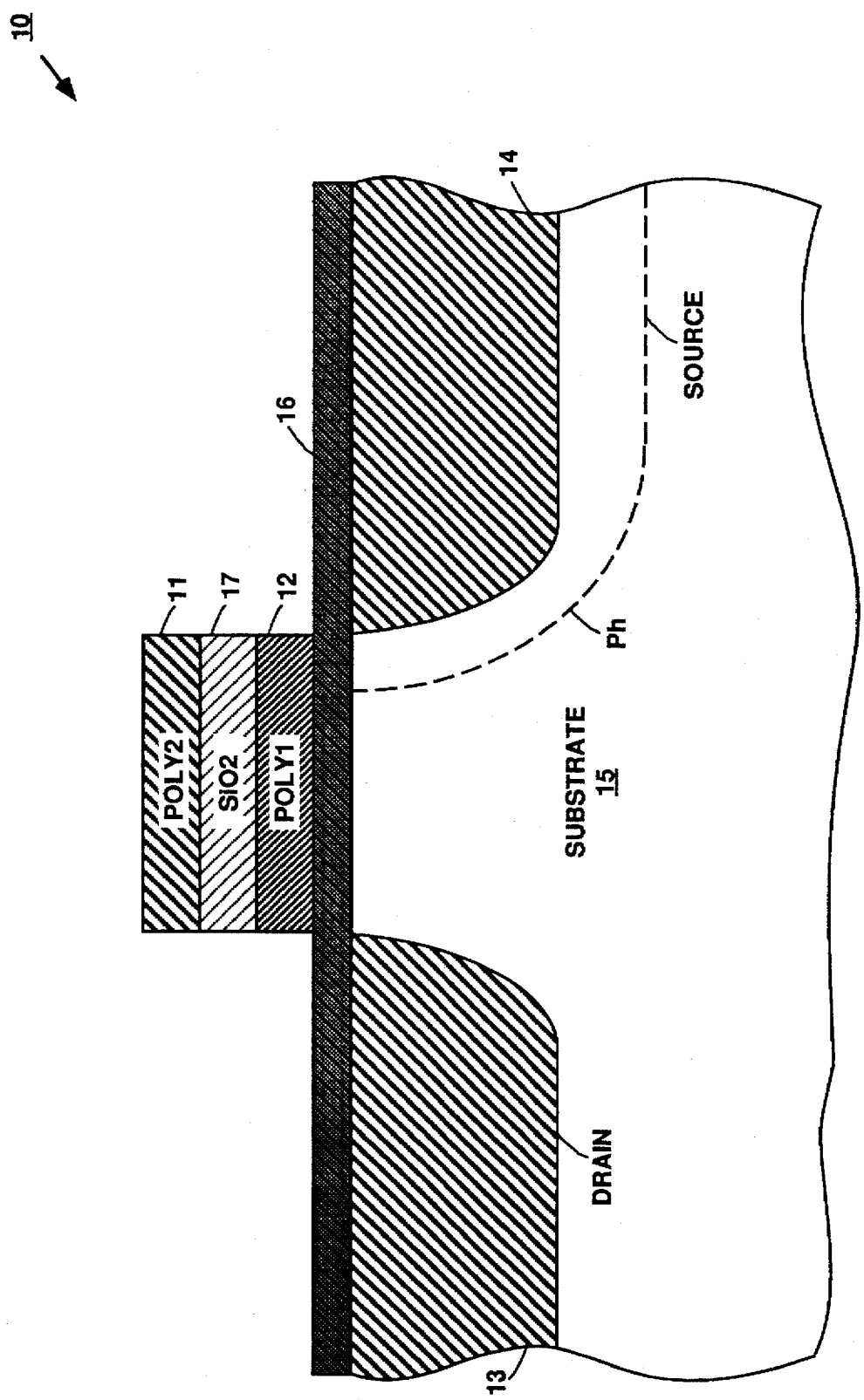
FIG. 1 shows a prior art floating gate flash EPROM cell.
Figure 2B:
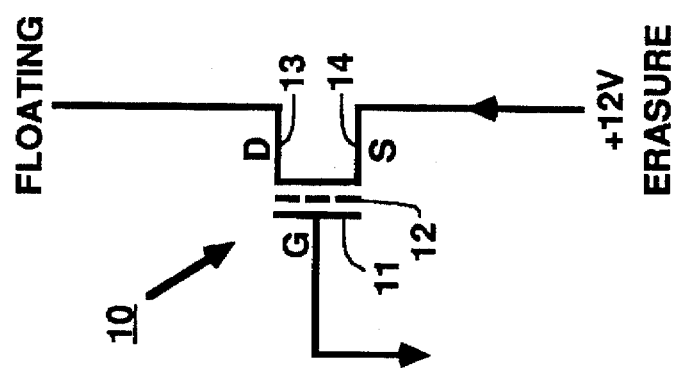
FIGS. 2A and 2B show a prior art arrangement of programming and erasing the floating gate flash EPROM cell of FIG. 1.
Figure 2A:
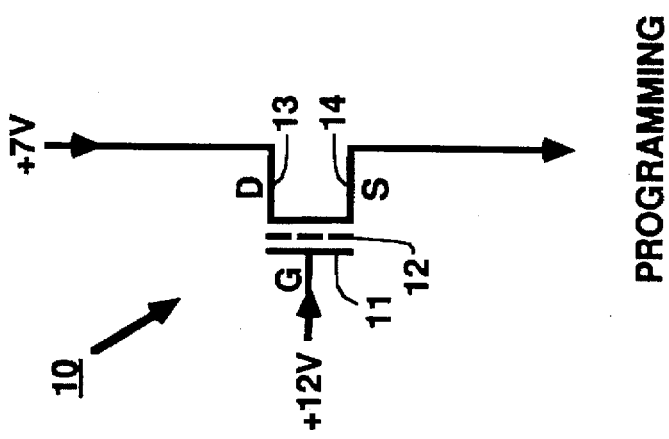
Figure 3:
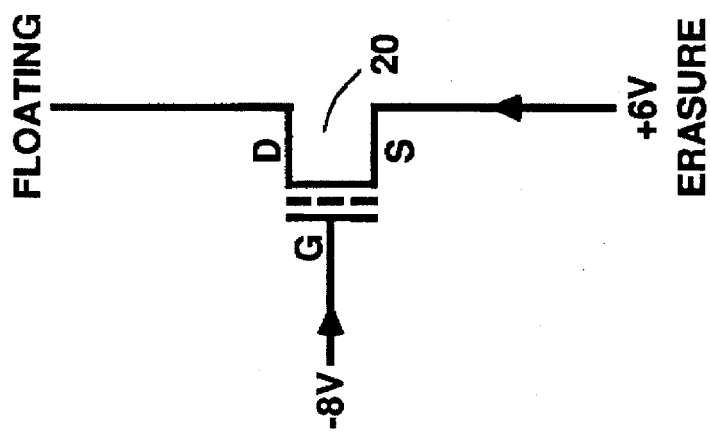
FIG. 3 shows an arrangement of erasing a floating gate flash EPROM cell with a negative gate voltage.

FIG. 3 shows an arrangement of erasing a flash EPROM cell 20 with a negative voltage. As can be seen from FIG. 3, the gate of memory cell 20 is applied with a negative voltage (i.e., −8 volts) instead of the ground voltage. In addition, the source of memory cell 20 is applied with a positive voltage that is substantially lower than a typical 12 volt erasure voltage (i.e., +6 volts). By doing so, the voltage across the gate and source of memory cell 20 is increased (i.e., higher than 12 volts) without causing the source-to-gate junction of memory cell 20 to enter into the breakdown region. This erasure is referred to as negative gate erasure. The negative gate erasure increases the erasure speed while preventing the source-to-gate junction of the memory cell from entering into the breakdown region that is detrimental to the memory cell.

In order to apply a negative voltage to the gates of memory cells of a flash EPROM during the erasure operation of the flash EPROM, a negative voltage switching circuit is required. As will be described in more detail below, the negative voltage switching circuit, in accordance with one embodiment of the present invention, generates another (i.e., a second) negative voltage having a voltage level lower than the first negative voltage to apply the first negative voltage to the gates of the memory cells during the erasure operation. The negative voltage switching circuit generates the second negative voltage from a positive voltage such that the flash EPROM does not require duplicate negative voltage sources for the negative gate erasure. In addition, the negative voltage switching circuit consumes substantially no power and can be fabricated using existing CMOS technology. Moreover, the negative voltage circuit does not consume any power when the first negative voltage is deselected (i.e., when the first negative voltage is at zero volts).

Briefly, the negative voltage switching circuit in accordance with one embodiment of the present invention includes a switching transistor connected to the first negative voltage. The switching transistor, when turned on, connects the first negative voltage to the gates of the memory cells. The negative voltage switching circuit also includes a control circuit for generating the second negative voltage to be applied to the gate of the switching transistor for turning on the switching transistor. The second negative voltage is generated from a positive voltage. In one embodiment, the control circuit includes a capacitor, a charging circuit for selectively coupling the first end of the capacitor to the positive voltage or ground, and a coupling circuit for coupling the second end of the capacitor to (1) ground when the charging circuit couples the first end of the capacitor to the positive voltage and (2) the gate of the switching transistor when the charging circuit couples the first end of the capacitor to ground. In another embodiment, the control circuit includes two capacitors coupled to a first logical circuit (i.e., a clock generation circuit) and a second logic circuit (i.e., a cross-coupled circuit). The first and second logic circuits cause the capacitors to alternately generate the negative voltage for turning on the switching transistor. The negative voltage switching circuit will be described in more detail below, in conjunction with FIGS. 4–8.

Figure 4:
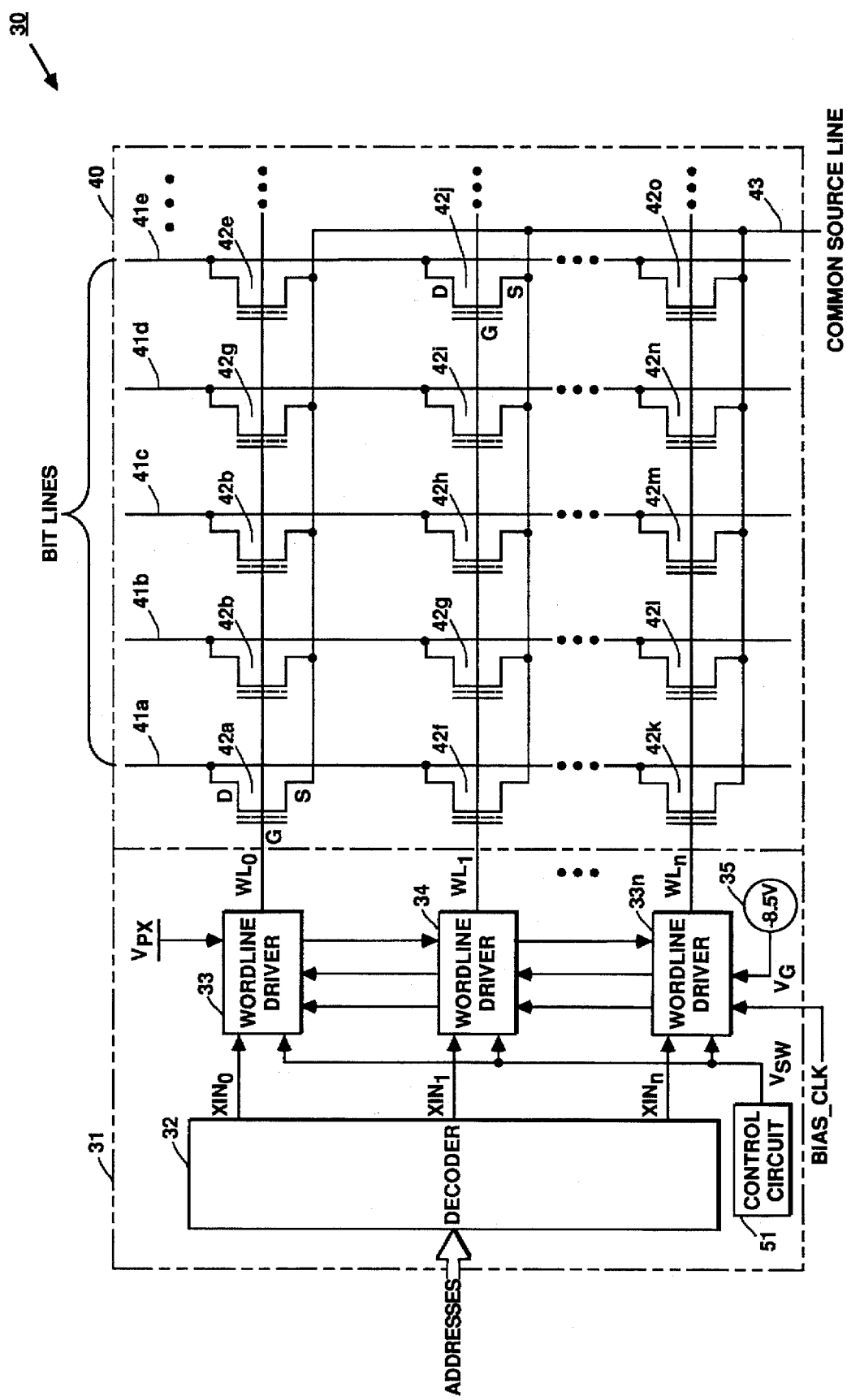
FIG. 4 shows a flash EPROM that includes word line drivers that apply the negative gate voltage to gates of the memory cells in response to a $V_{SW}$ negative voltage signal during the erasure operation of the flash EPROM.

Referring now to FIG. 4, a flash EPROM 30 is shown that includes a memory array 40 and an X decoding circuit 31 having the negative voltage switching circuit (shown in FIGS. 5 and 7) in accordance with one embodiment of the present invention. Memory array 40 includes floating gate flash EPROM cells 42a through 42o that are located at intersections of word lines WL0 through WLn and bit lines 41a through 41e. In addition, the source region of each of memory cells 42a–42o is connected to a common source line 43. Common source line 43 is then selectively connected to various voltages via a source switching circuit (not shown in FIG. 4).

Flash EPROM 30 can be used in any kind of computer system or data processing system. For example, the computer system can be a personal computer, a notebook computer, a laptop computer, a personal assistant, a minicomputer, a workstation, a mainframe, a multiprocessor computer, or any other type of computer system. In addition, the system in which flash EPROM 30 is used can be a printer, a cellular phone, a digital answering system, or any other data storage system.

For one embodiment, flash EPROM 30 employs MOS circuitry and all the circuitry of flash EPROM 30 resides on a single semiconductor substrate.

Figure 5:
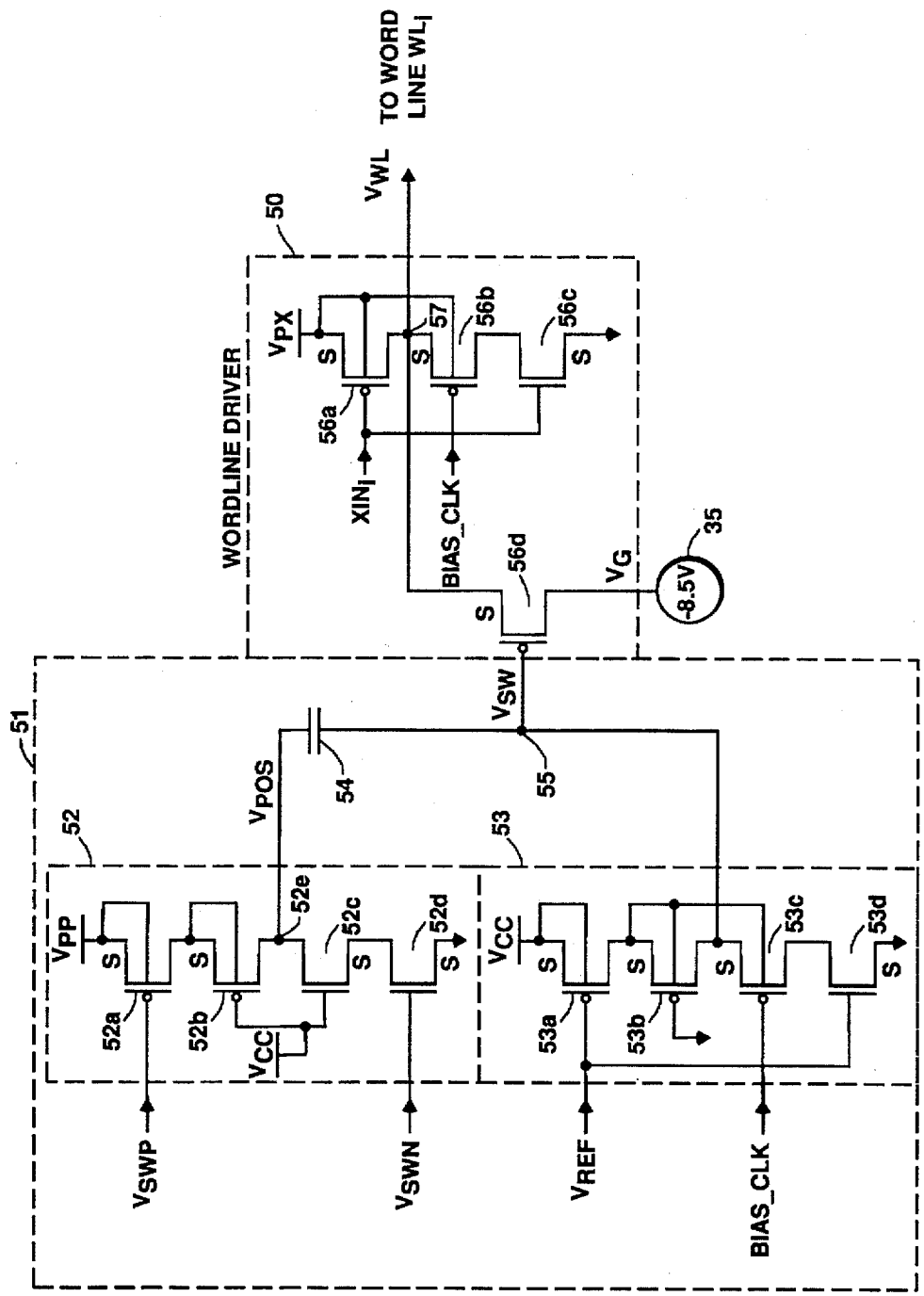
FIG. 5 shows the circuit of one of the word line drivers and a control circuit for generating the $V_{SW}$ signal of FIG. 4 in accordance with one embodiment of the present invention.
Figure 6:
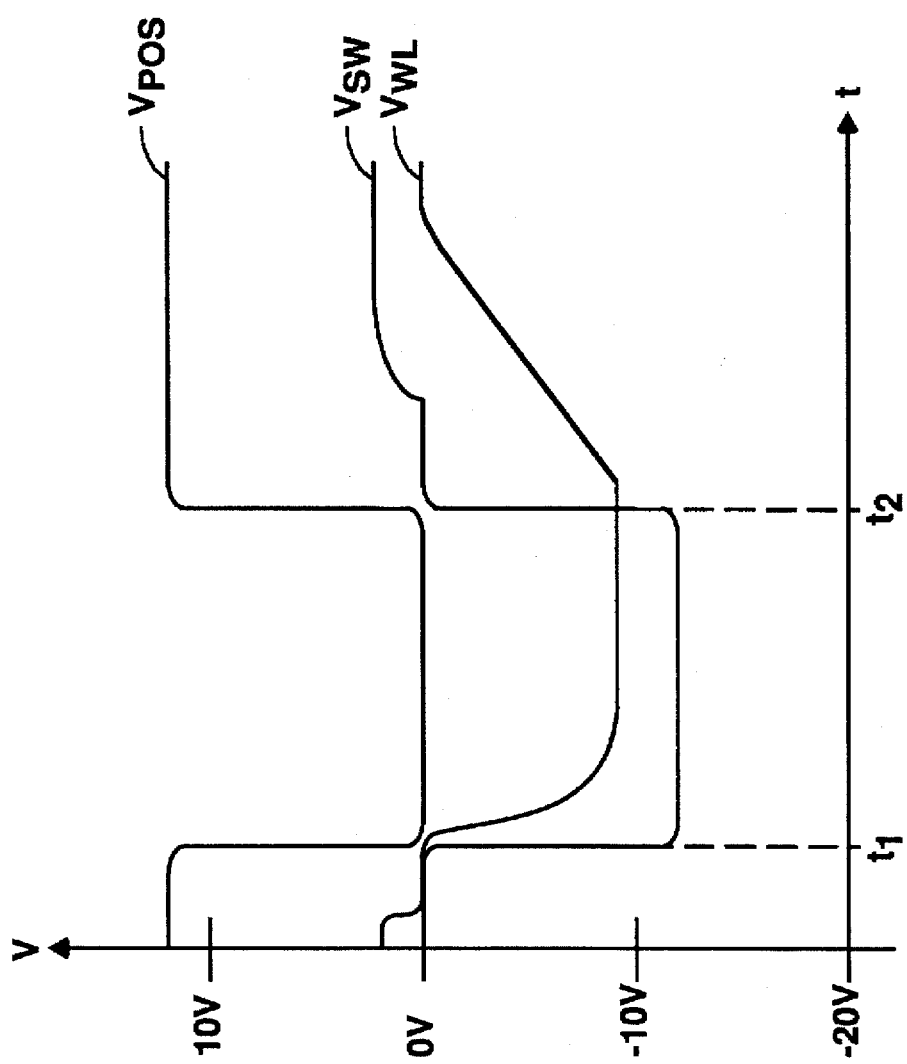
FIG. 6 shows the signal waveform of various signals generated by the circuits shown in FIG. 5.
Figure 7:
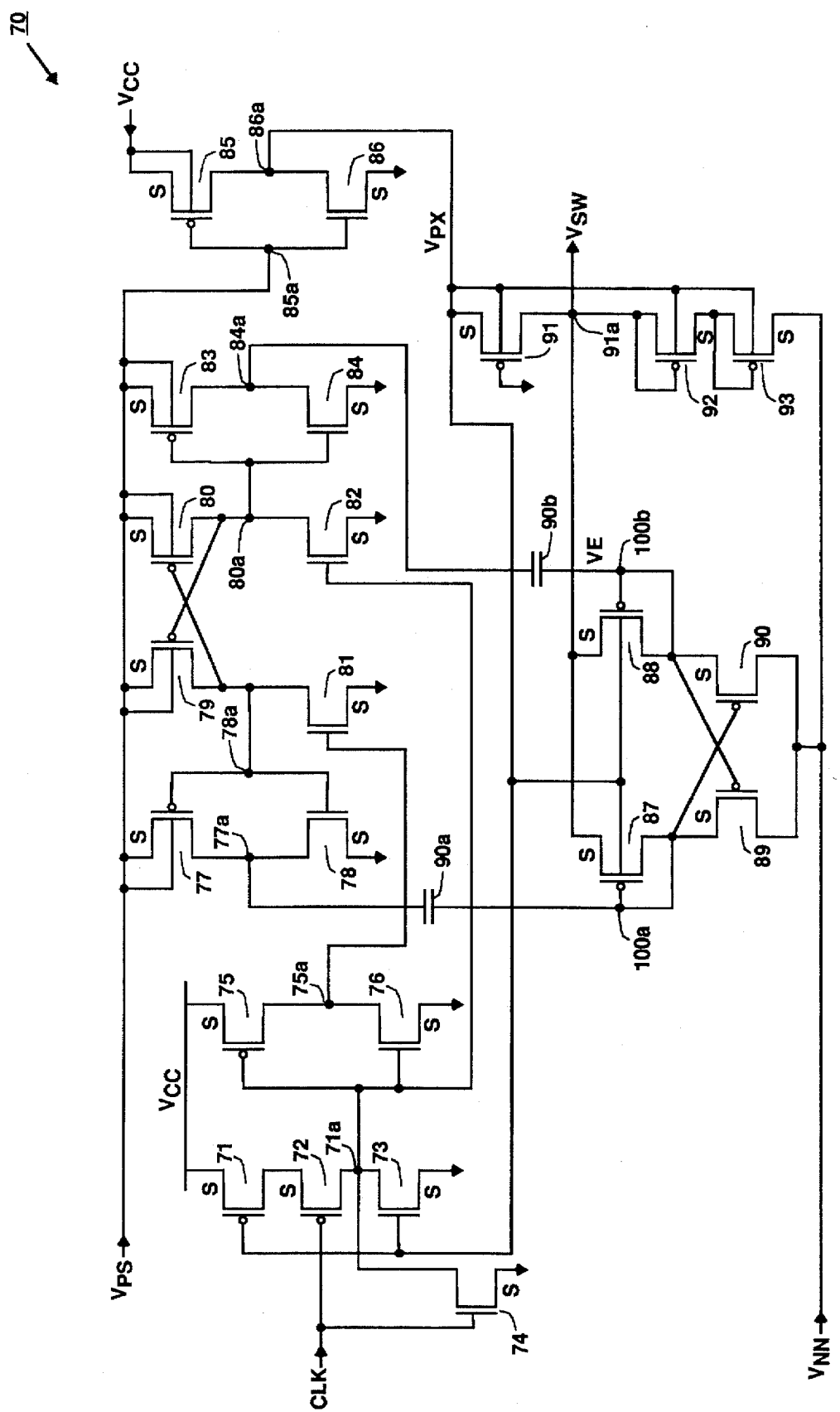
FIG. 7 shows the circuit of the control circuit of FIG. 4 in accordance with another embodiment of the present invention.

As can be seen from FIG. 4, decoding circuit 31 is connected to each of word lines WL0–WLn. Decoding circuit 31 includes an address decoder 32, a number of word line drivers 33 through 33n, and a control circuit 51. Each of word line drivers 33–33n is connected to one of the word lines WL0–WLn. Each of word line drivers 33–33n receives a select signal from decoder 32. For example, word line driver 33 receives the XIN0 select signal from decoder 32. In addition, each of word line drivers 33–33n receives a $V_{SW}$ voltage signal from control circuit 51. As will be described in more detail below, the $V_{SW}$ voltage signal is a negative voltage for controlling a switching transistor (not shown) within each of word line drivers 33–33n to connect a negative voltage $V_G$ from a negative voltage source 35 to each of word line drivers 33–33n during the erasure operation of flash EPROM 30. Control circuit 51 and the switching transistor in each of word line drivers 33–33n form the negative voltage switching circuit of the present invention. FIG. 5 shows the entire circuit of the negative voltage switching circuit in accordance with one embodiment of the present invention, which will be described in more detail below. FIG. 7 shows the circuit of control circuit 51 of FIG. 4 in accordance with another embodiment of the present invention, which will also be described in more detail below.

Referring back to FIG. 4, flash EPROM 30 also includes other circuits in addition to memory array 40 and decoding circuit 32. For example, flash EPROM 30 also includes a Y decoding circuit connected to bit lines 41a–41e and an on-chip control and state circuit that controls memory operations of flash EPROM 30. The control and state circuit is connected to the decoding circuits and memory array 40 for controlling the memory operations with respect to memory array 40. Both the Y decoding circuit and the control and state circuit can be implemented by known circuits and their functions are known in the art. For example, U.S. Pat. Nos. 5,369,647 and 5,327,383 describe a control and state circuit for controlling the memory operation of a flash EPROM. Moreover, other known circuits (e.g., the source switching circuit) may also be included in flash EPROM 30 to make flash EPROM 30 operative. The functions and operations of these other known circuits are also known in the art. FIG. 4 does not show those circuits in order not to unnecessarily obscure the description of the present invention.

Memory array 40 shown in FIG. 4 can be arranged into a number of erasure blocks by grouping a number of bit lines or word lines into one block. In that case, the sources of the memory cells within one block are connected to the common source line of the block.

Various known blocking techniques can be used to divide memory array 40 into a number of erasure blocks. For example, U.S. Pat. Nos. 5,065,364, 5,245,570, and 5,239,505 describe different blocking structures.

Decoder 32 can be implemented by any known decoding circuit. During the read or programming operation, decoder 32 receives and decodes a row address of flash EPROM 30 and selects one of the XIN0–XINn select signals. The selected one of XIN0–XINn select signals then activates its corresponding word line driver to apply the appropriate voltage onto its corresponding word line. When flash EPROM 30 undergoes the erasure operation, decoder 32 does not receive any row address and does not assert any of the XIN0–XINn select signals. Control circuit 51 now generates the negative voltage $V_{SW}$ signal to each of word line drivers 33–33n to turn on the switching transistor within each of word line drivers 33–33n to apply the negative voltage $V_G$ from negative voltage source 35 to each of word lines WL0–WLn. Meanwhile, a positive erasure voltage $V_{SE}$ is applied to the source of each of memory cells 42a–42o via common source line 43. Under these conditions, each of the memory cells within memory array 40 is erased.

For one embodiment, the negative voltage $V_G$ supplied by negative voltage source 35 is approximately −8.5 volts and the positive erasure voltage $V_{SE}$ applied to common source line 43 is approximately 6 volts. Alternatively, the $V_G$ voltage can be higher or lower than −8.5 volts and the $V_{SE}$ voltage can be higher or lower than 6 volts.

Moreover, negative voltage source 35 may include a negative voltage charge pump for generating the $V_G$ negative voltage. The negative voltage charge pump can be any known negative voltage charge pump.

In accordance with one embodiment of the present invention, control circuit 51 generates the $V_{SW}$ negative voltage signal when desired (i.e., when flash EPROM 30 undergoes the erasure operation). The voltage level of the $V_{SW}$ negative voltage is lower than the $V_G$ negative voltage, thus turning on the switching transistor in each of the word line drivers. When the negative voltage $V_G$ is not required, control circuit 51 causes the $V_{SW}$ signal to be at a positive voltage ($V_{CC}$), thus turning off the switching transistors which decouple the $V_G$ negative voltage from the word lines WL0–WLn.

FIG. 5 shows the circuit of control circuit 51 of FIG. 4 in accordance with one embodiment of the present invention.

FIG. 7 shows the circuit of a control circuit 70 which implements another embodiment of control circuit 51 of FIG. 4. The circuits shown in FIGS. 5 and 7 will be described in more detail below.

Referring to FIG. 5, the circuit of control circuit 51 of FIG. 4 and a word line driver 50 is shown. Word line driver 50 can be any one of word line drivers 33 through 33n of FIG. 4. As can be seen from FIG. 5, word line driver 50 includes transistors 56a through 56c connected in series between a $V_{PX}$ power supply voltage and ground. Transistors 56a and 56b are P-channel transistors with their substrates connected to the $V_{PX}$ power supply voltage. Transistor 56c is an N-channel transistor. Transistors 56a and 56c together form an inverter. Transistors 56b serves as an isolation transistor for isolating node 57 from transistor 56c in accordance with a BIAS_CLK signal. The gate of transistors 56a and 56c receives the $XIN_i$ select signal. The $XIN_i$ select signal can be any one of the XIN0–XINn select signals (FIG. 4). The gate of transistor 56b receives the BIAS_CLK control signal. For one embodiment, the BIAS-CLK signal can be a periodic signal (e.g., a clock signal). Node 57 is the output node of word line driver 50 and provides the output voltage $V_{WL}$ to a word line $WL_i$. Again, word line $WL_i$ can be any one of word lines WL0–WLn (FIG. 4).

Word line driver 50 also includes a P-channel transistor 56d connected between node 57 and negative voltage source 35. Transistor 56d is the switching transistor of the negative voltage switching circuit for controlling the application of the negative voltage $V_G$ from negative voltage source 35 to word line $WL_i$ at node 57. The gate of switching transistor 56d receives the $V_{SW}$ voltage signal from control circuit 51. Thus, the $V_{SW}$ signal controls the switching of transistor 56d. Transistor 56d also has its substrate connected to the $V_{PX}$ voltage.

Without the requirement for both positive and negative voltages to be produced on the word line $WL_i$, word line driver 50 functions as an inverter and transistor 56d is off while transistor 56b is controlled to be on by the BIAS_CLK signal. However, when the negative voltage is to be applied onto word line $WL_i$ via node 57 from negative voltage source 35, isolation transistor 56b is switched off by the BIAS_CLK signal to isolate node 57 from transistor 56c while switching transistor 56d is switched on by the negative voltage $V_{SW}$ to apply the negative voltage to word line $WL_i$ via node 57.

Alternatively, another P-channel isolation transistor can be added to word line driver 50. The added P-channel transistor can be connected between node 57 and P-channel transistor 56a for isolating node from transistor 56a.

As can be seen from FIG. 5, transistor 56d serves as a switch for the negative voltage $V_G$ from negative voltage source 35 and does not consume any power, either when connecting the negative voltage to node 57 or when not connecting the negative voltage to node 57 from source 35.

Control circuit 51 forms another part of the negative voltage switching circuit. Control circuit 51 generates the negative voltage $V_{SW}$ during the erasure operation of flash EPROM 30 (FIG. 4) to cause switching transistor 56d to apply the $V_G$ negative voltage to the word line $WL_i$. As can be seen from FIG. 5, control circuit 51 includes a capacitor 54 having one end (i.e., the negative end) connected to a node 55 of control circuit 51. Capacitor 54 serves as a voltage translation to convert a positive voltage into a negative voltage. Node 55 is also connected to the gate of switching transistor 56d.

In addition, control circuit 51 also includes a charging circuit 52 connected to the other end (i.e., the positive end) of capacitor 54. Moreover, control circuit 51 also includes a coupling circuit 53 connected to capacitor 54 via node 55.

Charging circuit 52 includes a number of transistors 52a through 52d. Transistors 52a and 52b are P-channel transistors and transistors 52c and 52d are N-channel transistors. Capacitor 54 is connected to charging circuit 52 at node 52e. Transistors 52a and 52d form an inverter and transistors 52b and 52c limit voltage stress on transistors 52a and 52d. These two transistors (i.e., transistors 52b and 52c) are constantly on. Transistor 52a is controlled by a $V_{SWP}$ signal to apply the $V_{PP}$ voltage to node 52e and transistor 52d is controlled by a $V_{SWN}$ signal to connect ground to node 52e. The $V_{SWP}$ and $V_{SWN}$ signals are alternately asserted.

For one embodiment, the $V_{SWN}$ signal is asserted while the $V_{SWP}$ signal is deasserted when flash EPROM 30 (FIG. 4) is undergoing the erasure operation and the $V_{SWN}$ signal is deasserted while the $V_{SWP}$ signal is asserted when flash EPROM 30 is not undergoing the erasure operation. For another embodiment, the $V_{SWP}$ and $V_{SWN}$ signals can be alternately asserted during the erasure operation of flash EPROM 30 such that the erasure operation is a pulsed operation.

For one embodiment, the asserted voltage level of the $V_{SWP}$ signal, when asserted, is approximately 12 volts and the voltage level of the $V_{SWP}$ signal, when not asserted, is approximately 3 volts. In this case, the voltage level of the $V_{SWN}$ signal, when asserted, is approximately 3 volts and, when not asserted, is approximately zero volts. For one embodiment, the $V_{PP}$ voltage is approximately 12 volts and the $V_{CC}$ voltage is approximately 3 volts.

Coupling circuit 53 also includes a number of transistors 53a through 53d connected in series between the $V_{CC}$ voltage and ground. Transistors 53a–53c are P-channel transistors and transistor 53d is an N-channel transistor. Transistors 53a and 53d are controlled by a $V_{REF}$ signal and transistor 53b is constantly on. Transistor 53c is controlled by the BIAS_CLK signal. Transistors 53a and 53d couple node 55 to ground and the $V_{CC}$ voltage, respectively, and transistor 53c serves as the isolation transistor to isolate node 55 from ground under control of the BIAS_CLK signal. Transistors 53b and 53c also limit the voltage stresses on transistors 53a and 53d, respectively.

The function of charge circuit 52 is to (1) charge capacitor 54 to the $V_{PP}$ voltage when coupling circuit 53 connects node 55 to ground and then (2) connect node 52e to ground when coupling circuit 53 causes node 55 to be isolated from ground and only connected to the gate of switching transistor 56d and capacitor 54. By doing so, the $V_{SW}$ voltage at node 55 becomes negative. This negative voltage then turns on switching transistor 56d to apply the $V_G$ negative voltage to node 57. Coupling circuit 53 then causes node 55 to be connected to ground, turning off switching transistor 56d. The function of control circuit 51 to generate the $V_{SW}$ negative voltage is described in more detail below, also in conjunction with FIG. 6.

During operation and initially, the $V_{SWP}$ signal is asserted and the $V_{SWN}$ signal is deasserted. This turns on transistor 52a and turns off transistor 52d. As a result, node 52e applies the $V_{PP}$ voltage to the positive end of capacitor 54.

Meanwhile, the $V_{REF}$ signal is logically low (e.g., ground). This causes node 55 to be connected to the $V_{CC}$ voltage. This charges capacitor 54 to approximately 9 volts (i.e., $V_{PP}$–$V_{CC}$). At this time, transistor 56d of word line driver 50 is turned off and the $XIN_i$ signal is not asserted and the BIAS_CLK signal causes transistors 53c and 56b to be on. Node 57 in turn is at the ground voltage.

For one embodiment, the BIAS_CLK signal is at approximately –3 volts when asserted and at the ground voltage when not asserted.

Next, the $V_{REF}$ signal goes to the logical high state, which turns on transistor 53d and turns off transistor 53a. Meanwhile, the BIAS_CLK signal remains asserted. This causes node 55 to be connected to ground via transistor 53d, further charging capacitor 54 to the $V_{PP}$ voltage (i.e., $V_{POS}$ is 12 volts), as can be seen from FIG. 6.

At this time, transistor 56d remains off and transistor 56b is still on, causing node 57 to remain at the ground voltage.

Next, the BIAS_CLK signal is deasserted, turning both transistors 53c and 56b off. At this time, node 55 floats while node 57 still assumes the ground voltage. Then, the $V_{SWP}$ signal is deasserted and the $V_{SWN}$ signal is asserted, causing node 52e to be connected to ground via transistor 52d. This causes the $V_{POS}$ voltage at the positive end of capacitor 54 to be at the ground voltage. Meanwhile, node 55 has been disconnected from ground by transistor 53c, as described above. At this time, however, capacitor 54 still has a voltage difference of approximately 12 volts (i.e., $V_{POS}$–$V_{SW}$ is equal to 12 volts). Because the $V_{POS}$ voltage now is at ground, a negative voltage $V_{SW}$ is now generated and applied to the gate of transistor 56d (see FIG. 6 at timing t1). This negative voltage $V_{SW}$ is more negative than the $V_G$ voltage, thus turning on transistor 56d to cause the negative $V_G$ voltage to be produced at node 57.

In order to disconnect the negative voltage $V_G$ from node 57 (i.e., after the erasure operation), the $V_{SWP}$ signal is asserted and the $V_{SWN}$ signal is deasserted. This causes node 52e to be connected to the $V_{PP}$ voltage, which in turn causes the $V_{SW}$ voltage to be the ground voltage, turning off transistor 56d. At this time, both nodes 55 and 57 are floating and the $V_{WL}$ voltage at node 57 remains at the negative $V_G$ voltage.

The BIAS_CLK signal is then asserted, causing both nodes 55 and 57 to be connected to ground via transistors 53d and 56c, respectively. At this time, node 57 returns to the ground voltage (see FIG. 6).

Referring now to FIG. 7, control circuit 70 implements another embodiment of control circuit 51 of FIG. 4. FIG. 7 does not show the circuit of the word line driver, which is shown in FIG. 5. As can be seen from FIG. 7, control circuit 70 includes two capacitors 90a and 90b, instead of a single capacitor. In addition, another negative voltage $V_{NN}$ signal is used in the circuit. A positive voltage $V_{PS}$ signal is also used in control circuit 70.

For one embodiment, the $V_{NN}$ negative voltage swings between –8.5 volts and zero volts and the CLK signal is a 40 MHz clock signal. The $V_{PS}$ voltage swings between approximately zero volts and 6 volts.

Control circuit 70 includes two circuit parts: clock generation and negative voltage creation. The clock generation part of control circuit 70 includes a two-input NOR gate formed by P-channel transistors 71 and 72 and N-channel transistors 73 and 74 and an inverter formed by CMOS transistors 75 and 76. The CLK signal is applied to the input of the NOR gate. The CLK signal is generated when the switching transistor (i.e., transistor 56d of FIG. 5) is to be turned on. At this time the $V_{PS}$ voltage is at 6 volts and the $V_{NN}$ voltage is at –8.5 volts. Node 71a outputs the output signal of the NOR gate and node 75a applies the complement signal of the output of the NOR gate.

The clock generation part of control circuit 70 also includes a voltage level conversion circuit formed by transistors 79 through 82 for converting the voltage level of the outputs of the NOR gate and the inverter from the $V_{CC}$ voltage to the $V_{PS}$ voltage. During the erase operation, the $V_{PS}$ voltage is at +6 volts. Transistors 79 and 80 are P-channel transistors and transistors 81 and 82 are N-channel transistors. Nodes 78a and 80a produce a pair of complement outputs of the voltage level conversion circuit. Node 78a is connected to the positive end of capacitor 90a via an inverter formed by CMOS transistors 77 and 78. Node 80a is connected to the positive end of capacitor 90b via an inverter formed by CMOS transistors 83 and 84. The zero to 6 volt voltage swing of the signals at nodes 78a and 80a are then shifted to voltage swings of −6 volts to −12 volts by use of capacitors 90a and 90b with the help of the negative voltage creation part of control circuit 70.

Figure 8:
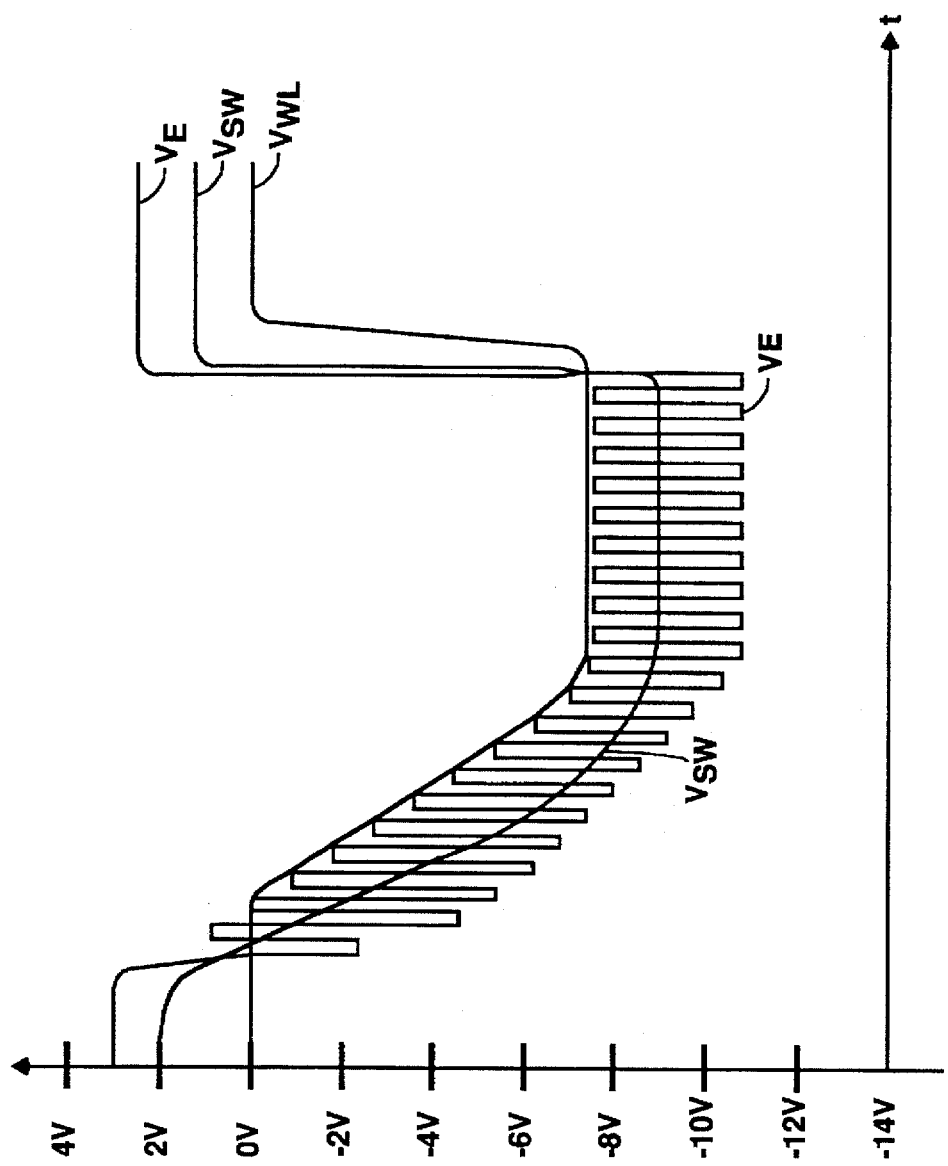
FIG. 8 shows the signal waveform of various signals generated by the circuit shown in FIG. 7.

The negative voltage creation part of control circuit 70 includes a P-channel transistor 89 as a switched load for the negative end of capacitor 90a and a P-channel transistor 90 as a switched load for the negative voltage end of capacitor 90b. When node 77a goes to +6 volts and node 84a goes to ground, transistor 89 is turned on by having its gate go to −12 volts, thereby connecting the negative end of capacitor 90a to the $V_{NN}$ negative voltage of approximately −8 volts. At this time, a 14 volt charge will be developed on capacitor 90a. When node 77a then goes to the ground voltage and node 84a goes to +6 volts because of the CLK signal, the negative end of capacitor 90a (i.e., node 100a) goes to −12 volts. This is the resulting voltage that will maintain charge conservation on capacitor 90a. The −12 volt voltage on node 100a is then transferred to node 91a through P-channel transistor 87, with a resulting voltage drop of approximately 2 volts. This creates a negative voltage $V_{SW}$ of approximately −10 volts. FIG. 8 shows the voltage waveform of various voltages.

Likewise, P-channel transistors 88 and 90 perform the same operations on the other complement clock signal produced at node 80a. Thus, nodes 100a and 100b alternately provide the negative voltage $V_{SW}$ at node 91a (as can be seen from FIG. 8).

The negative voltage creation part of control circuit 70 also includes an off circuit formed by P-channel transistor 91. When the switching transistor (i.e., transistor 56d in FIG. 5) is to be switched off, the CLK signal is stopped and the $V_{PS}$ voltage drops to zero volts and the $V_{NN}$ voltage goes to ground. When this occurs, transistor 91 pulls node 91a to the $V_{PX}$ voltage which is approximately 3 volts.

P-channel transistors 92 and 93 serve as clamping transistors for limiting the voltage level at node 91a to approximately 2 volts more negative than the $V_{NN}$ voltage.

Because the $V_{SW}$ voltage at node 91a tends not to be affected by the stray capacitance, control circuit 70 can be used for a relatively large memory array and can be connected to turn on a large number of switching transistors. In addition, smaller capacitors are employed for capacitors 90a and 90b. However, relatively more power is needed to generate the $V_{SW}$ negative voltage. In addition, control circuit 70 does not require the high $V_{PP}$ voltage to generate the high negative voltage $V_{SW}$. This eliminates voltage stress limiting transistors in the circuit.

Control circuit 51 shown in FIG. 5 is particularly suitable to drive a relatively smaller memory array. This is due to the fact that if a relatively large number of switching transistors are connected to node 55, the stray capacitance at node 55 may increase. This may cause the negative voltage $V_{SW}$ at node 55 to drop. Control circuit 70 shown in FIG. 7 is, however, suitable for a relatively large memory array. Control circuit 51 of FIG. 5 consumes relatively less power to generate the negative voltage $V_{SW}$ than control circuit 70 of FIG. 7 does. Control circuit 51 of FIG. 5 requires a single and relatively large capacitor. Control circuit 70 of FIG. 7, however, requires two relatively small capacitors.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A voltage switching circuit, comprising:
   (A) a low power switching circuit for selectively coupling a first voltage having a voltage level substantially lower than zero volts to an output of the low power switching circuit; and
   (B) a control circuit coupled to the low power switching circuit for controlling the low power switching circuit to couple the first voltage to the output by generating a second voltage having a voltage level lower than that of the first voltage from a third voltage having a voltage level substantially higher than zero volts, the control circuit including first and second capacitors alternatingly coupled to the low power switching circuit to generate the second voltage.

2. The voltage switching circuit of claim 1, wherein the low power switching circuit further comprises a P-channel switching transistor coupled between the output of the low power switching circuit and the first voltage.

3. The voltage switching circuit of claim 1, wherein the control circuit further comprises
   (a) the first capacitor having a first end and a second end;
   (b) the second capacitor having a first end and a second end;
   (c) a first logic circuit coupled to receive a periodic signal and coupled to the first end of each of the first and second capacitors for alternately coupling the first end of each of the first and second capacitors to one of (1) the third voltage and (2) ground under control of the periodic signal; and
   (d) a second logic circuit coupled to (1) the second end of each of the first and second capacitors and (2) the low power switching circuit for alternately coupling the second end of each of the first and second capacitors to the low power switching circuit, wherein when the second logic circuit couples the second end of the first capacitor to the low power switching circuit and the second end of the second capacitor to a fourth voltage, the first logic circuit couples the first end of the first capacitor to ground and the first end of the second capacitor to the third voltage.

4. The voltage switching circuit of claim 3, wherein the second logic circuit further comprises a plurality of cross-coupled P-channel transistors coupled between the first and second capacitors and the fourth voltage.

5. The voltage switching circuit of claim 3, wherein the first logic circuit further comprises a voltage translation circuit coupled to the third voltage, the periodic signal and ground.

6. A voltage switching circuit, comprising:
   (A) a low power switching circuit having a switching transistor coupled between a first voltage and an output, wherein the first voltage has a voltage level substantially lower than zero volts;

(B) a first capacitor having a first end and a second end;

(C) a second capacitor having a first end and a second end;

(D) a first logic circuit coupled to the first end of each of the first and second capacitors for alternately coupling the first end of each of the first and second capacitors to one of (1) a second voltage having a voltage level higher than zero volts and (2) ground; and (E) a second logic circuit coupled to the second end of each of the capacitors and the gate of the switching transistor for alternately coupling the second end of each of the capacitors to the gate of the switching transistor such that a third voltage having a voltage level lower than that of the first voltage is generated and applied to the gate of the switching transistor for causing the switching transistor to couple the first voltage to the output.

7. The voltage switching circuit of claim 6, wherein when the second logic circuit couples the second end of the first capacitor to the gate of the switching transistor and the second end of the second capacitor to a fourth voltage, the first logic circuit couples the first end of the first capacitor to ground and the first end of the second capacitor to the second voltage.

8. The voltage switching circuit of claim 6, wherein the second logic circuit further comprises a plurality of cross-coupled P-channel transistors.

9. The voltage switching circuit of claim 7, wherein the first logic circuit further comprises (a) a gate circuit coupled to receive a periodic signal;

(b) a voltage translation circuit coupled to the gate circuit for alternately coupling the first end of each of the capacitors to the second voltage under control of the gate circuit; and (c) a first inverter coupled between the voltage translation circuit and the first end of the first capacitor and a second inverter coupled between the voltage translation circuit and the first end of the second capacitor.

10. The voltage switching circuit of claim 7, further comprising (i) a de-coupling circuit coupled to the gate of the switching transistor for de-coupling the gate of the switching transistor from a fifth voltage having a voltage level higher than zero volts before the second voltage is applied to the gate of the switching transistor; and (ii) a clamping circuit coupled to the gate of the switching transistor for clamping the gate of the switching transistor above the fourth voltage having a voltage level lower than the third voltage when the second logic circuit alternately couples the second end of each of the capacitors to the gate of the switching transistor.

11. The voltage switching circuit of claim 10, wherein the decoupling circuit further comprises a P-channel transistor, wherein the clamping circuit further comprises a pair of P-channel transistors.

12. A nonvolatile memory, comprising:

(A) a memory cell;

(B) a low power word line driver coupled to a gate of the memory cell for selectively coupling a first voltage having a voltage level substantially lower than zero volts to the gate of the memory cell during a memory operation of the memory cell; and (C) a control circuit coupled to the word line driver for controlling the word line driver to couple the first voltage to the gate of the memory cell by generating a second voltage having a voltage level lower than that of the first voltage to control the word line driver to couple the first voltage to the gate of the memory cell, wherein the control circuit generate the second voltage from a third voltage having a voltage level substantially higher than zero volts, the control circuit including first and second capacitors alternatingly coupled to the word line driver to generate the second voltage.

13. The nonvolatile memory of claim 12, wherein the word line driver further comprises (i) a first P-channel transistor coupled between a power supply and an output node, wherein the word line driver is coupled to the gate of the memory cell via the output node;

(ii) a second P-channel transistor having a first end coupled to the output node;

(iii) a first N-channel transistor coupled between a second end of the second P-channel transistor and ground; and (iv) a third P-channel transistor coupled between the output node and the first voltage, wherein when the third P-channel transistor couples the first voltage to the output node, the first and second P-channel transistors are turned off to isolate the output node from the power supply and ground.

14. The nonvolatile memory of claim 12, wherein the control circuit further comprises (a) the first capacitor having a first end and a second end;

(b) the second capacitor having a first end and a second end;

(c) a first logic circuit coupled to receive a periodic signal and to the first end of each of the first and second capacitors for alternately coupling the first end of each of the first and second capacitors to one of (1) the third voltage and (2) ground under control of the periodic signal; and (d) a second logic circuit coupled to (1) the second end of each of the first and second capacitors and (2) the word line driver for alternately coupling the second end of each of the first and second capacitors to the word line driver, wherein when the second logic circuit couples the second end of the first capacitor to the word line driver and the second end of the second capacitor to a fourth voltage, the first logic circuit couples the first end of the first capacitor to ground and the first end of the second capacitor to the third voltage.

15. The nonvolatile memory of claim 14, wherein the second logic circuit further comprises a plurality of cross-coupled P-channel transistors coupled between the first and second capacitors and the fourth voltage.

16. The nonvolatile memory of claim 14, wherein the first logic circuit further comprises a voltage translation circuit coupled to the third voltage, the periodic signal and ground.

17. The nonvolatile memory of claim 12, wherein the nonvolatile memory is an electrically erasable and programmable memory.

18. The nonvolatile memory of claim 12, wherein the nonvolatile memory is used in a computer system.

* * * * *